United States Patent [19]

Peterson et al.

[11] Patent Number: 4,963,697

[45] Date of Patent: Oct. 16, 1990

[54] ADVANCED POLYMERS ON METAL PRINTED WIRING BOARD

[75] Inventors: Robert K. Peterson, Garland; Larry J. Mowatt, Allen; Aaron D. Poteet, Austin, all of Tex.

[73] Assignee: Texas Instruments Incorporated, Dallas, Tex.

[21] Appl. No.: 155,461

[22] Filed: Feb. 12, 1988

[51] Int. Cl.$^5$ ............................................. H05K 1/00
[52] U.S. Cl. ...................... 174/252; 29/831; 29/846; 361/403; 361/414
[58] Field of Search ............... 174/685; 361/403, 414; 29/831, 832, 843, 846; 427/97

[56] References Cited

U.S. PATENT DOCUMENTS

| | | | |
|---|---|---|---|
| 3,334,395 | 8/1967 | Cook et al. | 174/68.5 |
| 3,873,756 | 3/1975 | Gall et al. | 174/68.5 |
| 4,313,026 | 1/1982 | Yamada et al. | 361/414 X |
| 4,313,262 | 2/1982 | Barnes et al. | 29/831 X |
| 4,541,035 | 9/1985 | Carlson et al. | 174/68.5 X |
| 4,685,033 | 8/1987 | Inoue | 174/68.5 X |
| 4,706,165 | 10/1987 | Takenaka et al. | 174/68.5 X |
| 4,713,494 | 12/1987 | Oikawa et al. | 174/68.5 |
| 4,724,283 | 2/1988 | Shimada et al. | 174/68.5 |
| 4,736,521 | 4/1988 | Dohya | 174/68.5 X |

OTHER PUBLICATIONS

Sacher, E. et al., Printed-Circuit Boards with Low Coefficients of Expansion; IBM Technical Disclosure Bulletin, vol. 21, No. 2, July 1978, p. 500.

Tescher, Leland; New Circuit Boards Beat Heat and Vibration; Machine Design; Jan. 25, 1979, vol. 51, No. 2, pp. 105–109.

*Primary Examiner*—Morris H. Nimmo

[57] ABSTRACT

A printed wiring board is comprised of a combination of layers providing a good thermal match with surface mount components. The board consists of a core surrounded by multiple layers of dielectric and conductive materials optimized for their thermal expansion qualities. The core is also used as the tooling plate during manufacture. Side-to-side interconnects are made by blind-plated vias and through-holes in the core.

4 Claims, 2 Drawing Sheets

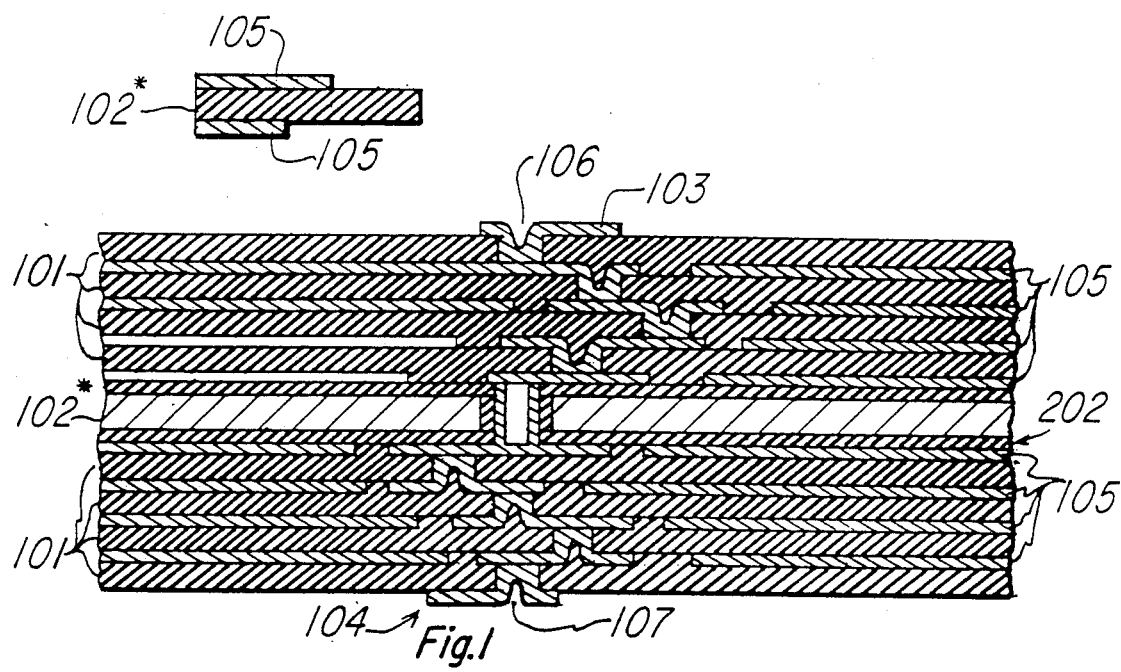
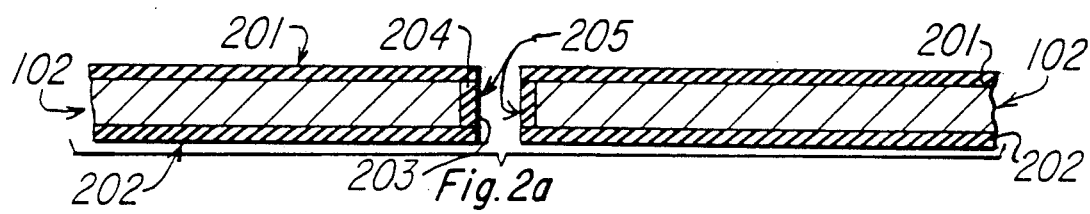
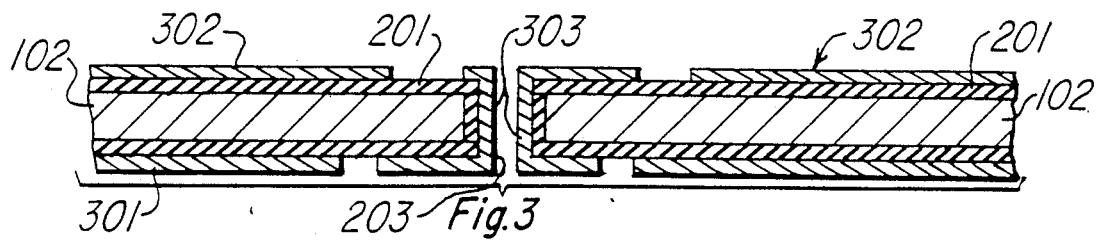
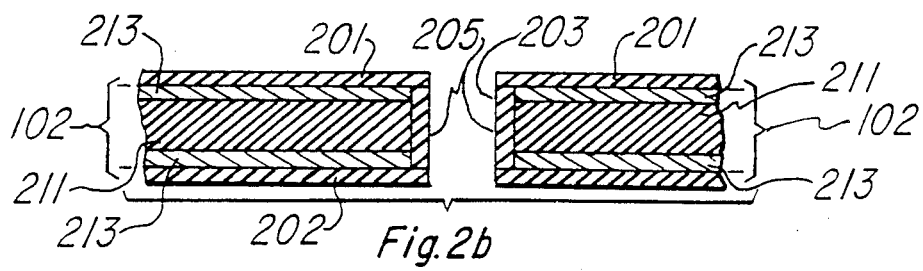

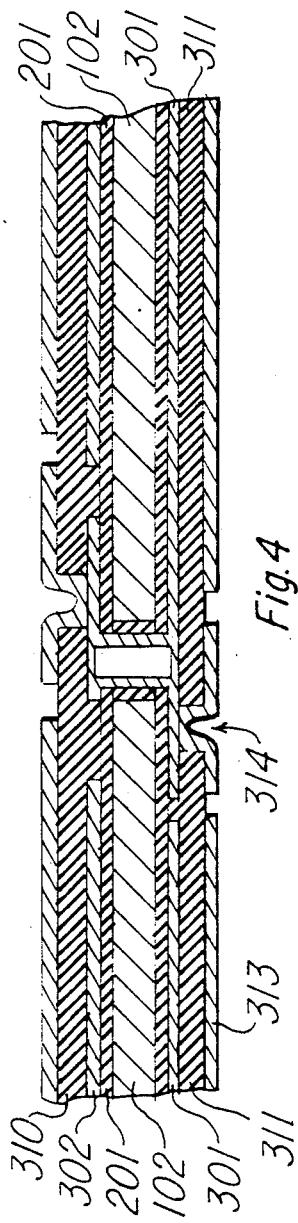
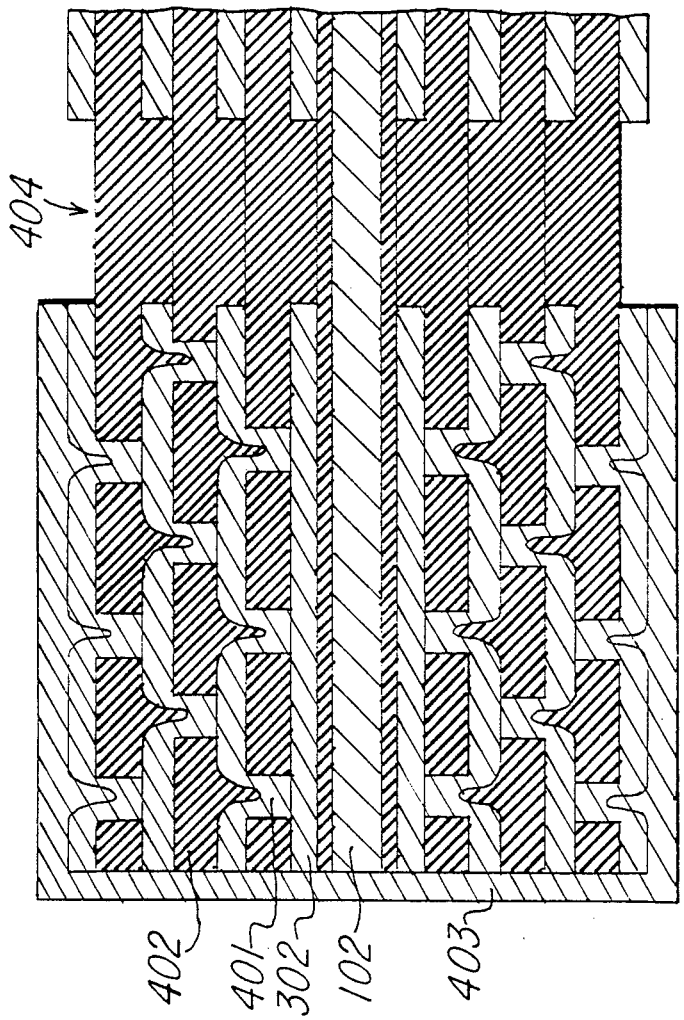

ADVANCED POLYMERS ON METAL PRINTED WIRING BOARD

BACKGROUND AND SUMMARY

This invention is in the field of printed wiring boards.

The primary structure for assembling circuitry in the past was the use of a printed wiring board having through-holes for mounting components with attached leads. This technique imposes constraints on the component density that can be achieved. This restriction is in direct conflict with the trend toward smaller system packages that necessitate higher component density.

To relieve the leaded-package limitations, the industry has developed surface mount technology for IC packaging. This in turn has caused several problems for the printed wiring board. The first of these problems is increased thermal energy that must be dissipated. Since the density of components has increased, then there is more heat generated in a given surface area than there was using leaded technology. Therefore the printed wiring board should provide some means for transporting the additional heat flux.

It is an object of the invention to provide a printed wiring board that functions as a heat-sink.

It is also an object of the invention to provide a structure allowing good thermal conductivity from an internal thermal plane to the exterior of the printed wiring board for removal of heat.

Another heat related problem is that of the difference in thermal expansion coefficients between the components and the printed wiring board. The temperature change will cause the individual components and the printed wiring board to expand at different rates. As there is a high probability that there is difference in the rate of expansion, then the solder joint between the component and the printed wiring board will be stressed. Also, deflection of the printed wiring board will produce stress in the solder joints.

It is therefore an object of the invention to have a printed wiring board structure that possesses similar thermal expansion characteristics to surface mount components that are attached.

It is also an object of the invention to have a bonding pad on a printed wiring board that compensates for thermal expansion mis-matches and deflections between the printed wiring board and components that are attached to the printed wiring board.

Another problem that exists with higher component density is the increase in interconnects. This leads to difficulty in manufacturing the printed wiring board.

It is an object of the invention to allow a high degree of interconnectivity between components.

A related problem to interconnects is that many printed wiring boards (particularly with surface mount components) are designed with components on both sides of the board. However there are problems with attempting to connect the two sides of the printed wiring board. Drilling through the entire board takes up valuable real-estate as well as vastly complicates a multilayer printed wiring board design. Wrap-a-round connections are complex, are expensive, limit the number of side-to-side connections possible, and are easily damaged in handling.

It is an object of the invention to provide a simple, economical form of side-to-side interconnects.

Manufacture of prior-art multi-layer printed wiring boards with internal thermal planes has involved building two separate printed wiring boards, and then bonding them to the thermal plane. This creates a number of problems. First there is an alignment problem in insuring that the two printed wiring boards align with respect to each other. Second is the problem of side to side interconnects. Either a wrap-a-round, or a drill-through technique is normally employed. Another problem is weight, in that all three elements (the two printed wiring boards and the thermal plane) have to be self-supporting.

It is an object of the invention to provide a method of manufacture of a printed wiring board in which a thermal plane is used as a tooling plate for the printed wiring board.

It is also an object of the invention to provide a manufacturing process for a printed wiring board that allows simultaneous build of both sides of a double sided printed wiring board.

It is a further object of the invention to provide a technique for building a printed wiring board that minimizes alignment problems.

It is still another object of the invention to provide a low-weight, rigid printed wiring board having an internal thermal plane.

These and other objects of the invention are achieved by: a printed wiring board having a top and bottom surface, said surfaces having a plurality of mounting pads, said printed wiring board further including:

a central, substantially rigid core with a top and bottom face;

said core having at least one conductive through-hole, said through-hole being electrically insulated with respect to said core;

said through-hole being electrically coupled to a first conductive region overlying said top face and to a second electrically conductive region overlying said bottom face;

said core being further overlaid with alternating insulating and patterned conducting layers;

selected portions of said patterned conductive layers being electrically coupled to said first and second conductive regions by conductive vias extending through said insulating layers; and selected ones of said mounting pads on said top and bottom surfaces being electrically coupled to said selected portions of said patterned conductive layers whereby an electrical interconnect extends from said top surface to said bottom surface.

BRIEF DESCRIPTION OF THE DRAWINGS

FIG. 1 illustrates a cross-section of the finished printed wiring board with a side-to-side interconnect.

FIGS. 2, 3, and 4 illustrate the steps of building the printed wiring board.

FIG. 5 illustrates the thermal interface region of the printed wiring board.

DETAILED DESCRIPTION OF THE INVENTION

Turning now to the drawings, FIG. 1 illustrates a cross-section of a portion of the finished printed wiring board. The core section (102) is surrounded by alternating layers of conductive material (105) and dielectric material (101). This cross-section also shows two device mounting pads (103 and 104) for soldering surface-mount devices. The device mounting pads (103 and 104) are electrically interconnected by blind-plated vias (such as 106 and 107) interconnecting through the conducting layers (105) and the core (102) by way of the blind plated hole (106).

The surface mounting pads (103 and 104) for surface mount devices are elongated where the device is to be attached. There are two major reasons for this. The first purpose is to allow a greater surface area to solder on the surface mount device. The second purpose is more important. The elongated pads (103 and 104) along with the underlying vias (106 and 107) allows a spring action to be used to help absorb any difference in thermal expansion between the printed wiring board and the surface mount device. This greatly reduces the stress that is placed on the soldered connection and thus promotes reliability. Because the dielectric and restraining layers (101) can, in some embodiments of the invention, be somewhat pliable, the blind-plated vias (106 and 107) may be allowed to flex. This further increases the spring action for the mounting pad (103 and 104).

The core section (102) may be made of copper, copper clad invar, copper clad molybdenum, aluminum, or other suitable materials. This core not only adds structural rigidity to the finished board, but it also functions as a heat sink and as a tooling plate during construction. These uses will become apparent in the following discussion.

The dielectric materials chosen for the preferred embodiment of the invention may include aramid fibers (such as Kevlar or Nomex), a glass fabric, quartz fabric or other suitable material. Any of these materials are employed with a polymer adhesive such as epoxy or polyimide. In one preferred embodiment of the invention, the conducting layers (105) are composed of copper.

The ratio between the high expansion metal and dielectric and the low expansion rate core may be adjusted to allow a controlled CTE (coefficient of thermal expansion) circuit board to be fabricated for use with surface mount devices. Ideal performance in a surface mount application is achieved when CTE, thermal, weight and electrical properties are optimized by proper choice of materials and geometries. Core modifications can also be made to enhance thermal, CTE or weight properties when specific needs must be met. These involve the use of clad materials in the core. The core may also be a composite of graphite, polymer, and/or copper. Non-constrained circuit boards can be made with standard glass, polymer and copper materials.

In one preferred embodiment of the invention, the core is formed of a conductive material such as copper. The manner in which the inner layers are formed for such an embodiment is shown in FIG. 2A. The core (102) is first drilled with an oversize hole (204). Next, the hole (204) is filled with a non-conductive filler (205) such as epoxy. This filler (205) material should be compounded such that the CTE matches that of the core material. The core (102) is then laminated with dielectric material forming insulating layers (201 and 202). A smaller hole (203) is then drilled through the insulating layers (201 and 202) and through the non-conductive filler (205). This creates an insulated through-hole in the core which will be used to form the side-to-side interconnects in the finished board.

FIG. 2B illustrates an embodiment wherein the core 102 comprises an insulator 211 clad with a metal layer 213 such as copper. In other embodiments of the inner layers, the core may be non-conductive as further illustrated in FIG. 1. In this case, only the smaller holes will have to be drilled to form the side-to-side interconnects. In still another embodiment, the core layer (102) may be delivered with a plurality of non-conductive plugs in place. When building the board, the user will only drill the smaller holes (203) where he wishes to place an interconnect, thus saving the user two steps (drilling the larger hole 204 and placing filler 205). Even this step may be saved if the core is delivered with pre-positioned conductive pins through the non-conductive pins.

FIG. 3 illustrates how the first circuit layer is added using the core (102) as a tooling plate. The inner layers comprising the core (102) and the insulating layers (201 and 202) are plated forming the first conductive layers (301 and 302). This also forms a conductive layer (303) in the through-hole 203, thus electrically interconnecting layers 301 and 302. The board is then etched in a conventional manner exposing dielectric layers 201 and 202 as needed to form the necessary circuit pattern.

Alternatively, the core may instead be laminated with a layer that consists of both the dielectric material and a conductive foil (such as copper). Both the conductive foil and the dielectric layer are then removed (by drilling, micro-blasting, laser, or some other way) where the interconnect is to be formed. These areas are then plated to form the interconnects or conductive passages. Next, the conductive layers are etched in a conventional manner to form the necessary circuit definition patterns.

Additional layers are added as shown in FIG. 4. Insulating layers (310 and 311) are laminated onto either side of the board. Where interconnects between layers are needed, vias (such as 314) are formed by removing the insulating layer by processes such as micro-blast or laser. Conducting layers (312 and 313) are electroplated onto the insulating layers (310 and 311). This electro-plating also plates the vias (such as 314) forming the interconnects between the first conducting layers (301 and 302) and the second conducting layers (313 and 312). The newly added conducting layers are then patterned by etching to form the circuit definition.

Alternatively, the additional layers may be added by laminating layers consisting of both the dielectric material and a conductive foil (such as copper). Both the conductive foil and the dielectric layer are then removed (by drilling, micro-blasting, laser, or some other way) where the interconnects are to be formed. These areas are then plated to form the conductive vias. The conductive layers are then etched in a conventional manner to form the necessary circuit definition patterns.

Subsequent layers are added in a like manner. This allows a sequential build-up of layers for the double-sided board. Because of the blind-plated vias and the use of through-holes, interconnections between the layers and side-to-side interconnects are easily formed during manufacture. In turn, there is automatic alignment of interconnecting traces even on opposite sides of the printed wiring board.

FIG. 5 is a view the thermal interface region of the present invention. In the preferred embodiment of the invention, this region is located along the edge of the printed wiring board. Alternative embodiments may employ the thermal interface elsewhere on the board. The thermal interface region is an integral part of the printed wiring board and is built in the manner described above. That is, the region is built up from the core (102), has conductive layers (302), blind-plated vias (401) and insulating layers (402). The core (102) in the preferred embodiment of the invention is made of copper or other thermally conductive material. The conducting layers (such as 302) and the vias (401) are also composed of a thermally transmissive material. The edge of the printed wiring board is plated with nickel (403), or other suitable material, after fabrication forming a durable contact surface and enhancing thermal conductivity.

In the thermal transfer region, the vias (such as 401) are spaced relatively closely and optionally staggered. The number of blind holes, spacing of the staggered combinations, and thickness of plating are all optimized to allow a maximum of heat to be conducted from the core (102) to the outside of the printed wiring board. In the preferred embodiment of the invention, the conductive layers (such as 302) are not patterned as they were for circuit definition. Again this is to allow a maximum of heat transfer. However as the vias electrically short all of the conducting layers together, it is necessary to pattern (404) the conductive layers outside of the thermal interface region to ensure circuit definition integrity.

While certain presently preferred embodiments of the invention have been discussed, these are intended merely as illustrative. Other embodiments of the invention are possible without departing from the scope of the invention. All limitations are set out in the claims below.

What is claimed is:

1. A printed wiring board having a top and bottom surface, said surfaces having a plurality of mounting pads, said printed wiring board further including:
   a central, substantially rigid core having a top face and a bottom face, said core substantially comprising a composite material clad with an electrically conductive metal, said core having at least one conductive through-hole, said through-hole being electrically insulated with respect to said core;
   a first insulative layer formed over the top face;
   a second insulative layer formed over the bottom face;
   a plurality of conductive and insulative layers overlying the first insulative layer;
   a plurality of alternating conductive and insulative layers overlying the second insulative layer, said through-hole being electrically coupled to a first conductive region overlying said top face and to a second electrically conductive region overlying said bottom face,
   selected portions of said patterned conductive layers being electrically coupled to said first and second conductive regions by conductive vias extending through said first and second insulating layers; and
   selected ones of said mounting pads on said top and bottom surfaces being electrically coupled to said selected portions of said patterned conductive layers whereby an electrical interconnect extends through said rigid core from said top surface to said bottom surface.

2. The printed wiring board of claim 1 wherein the through-hole is lined with non-conductive material.

3. The printed wiring board of claim 2 wherein the non-conductive material lining the through-hole has a coefficient of thermal expansion which matches that of the composite material.

4. The printed wiring board of claim 1 wherein the composite material is electrically insulative.

* * * * *

UNITED STATES PATENT AND TRADEMARK OFFICE
CERTIFICATE OF CORRECTION

PATENT NO.  : 4,963,697

DATED       : Oct. 16, 1990

INVENTOR(S) : Robert K. Peterson, Larry J. Mowatt, Aaron D. Poteet and Tony K. Johnson It is certified that error appears in the above-identified patent and that said Letters Patent is hereby corrected as shown below:

On the title page, item [75], add --Tony K. Johnson-- as the fourth inventor.

Signed and Sealed this

Twenty-first Day of April, 1992

Attest:

HARRY F. MANBECK, JR.

*Attesting Officer*  *Commissioner of Patents and Trademarks*